United States Patent [19]

Yatsuo et al.

[11] Patent Number: 4,500,903
[45] Date of Patent: Feb. 19, 1985

[54] SEMICONDUCTOR GTO SWITCHING DEVICE WITH RADIALLY ELONGATED CATHODE EMITTER REGIONS OF INCREASING LENGTH

[75] Inventors: Tsutomu Yatsuo; Takahiro Nagano; Saburo Oikawa, all of Hitachi; Akira Horie, Katsuta, all of Japan

[73] Assignee: Hitachi, Ltd., Tokyo, Japan

[21] Appl. No.: 384,520

[22] Filed: Jun. 3, 1982

[30] Foreign Application Priority Data

Jun. 5, 1981 [JP] Japan ............................ 56-85760

[51] Int. Cl.$^3$ ............................................ H01L 29/74
[52] U.S. Cl. .................................. 357/38; 357/20; 357/36
[58] Field of Search .......................... 357/20, 36, 38

[56] References Cited

FOREIGN PATENT DOCUMENTS 50-7427  3/1975  Japan .......................... 357/38 G Primary Examiner—Joseph E. Clawson, Jr.
Attorney, Agent, or Firm—Antonelli, Terry & Wands

[57] ABSTRACT

A gate turn-off thyristor in which a cathode-emitter layer is divided into a plurality of strip-like regions which are radially arrayed on a major surface of a semiconductor substrate in a coaxial multi-ring pattern including a plurality of coaxially arrayed rings. The cathode-emitter strips belonging to a given one of the rings have some radial length. The cathode-emitter strips belonging to the inner ring of a coaxial multi-ring pattern have a smaller radial length than that of the cathode-emitter strips constituting the outer ring. A cathode electrode is contacted to the cathode-emitter strip in low resistance ohmic contact. A gate electrode is ohmic contacted with a low resistance to a cathode-base layer located adjacent to the cathode-emitter strip so as to enclose it. An anode electrode is ohmic contacted with a low resistance to the anode-emitter layer. With the structure of GTO, turn-off operation of unit GTO's each including a cathode-emitter strip is equalized.

11 Claims, 12 Drawing Figures

SEMICONDUCTOR GTO SWITCHING DEVICE WITH RADIALLY ELONGATED CATHODE EMITTER REGIONS OF INCREASING LENGTH

The present invention relates generally to a semiconductor switching device. In particular, the invention concerns a gate turn-off power thyristor which is turned on and off by a control signal (gate signal) applied to a gate electrode of the thyristor.

In a gate turn-off thyristor (hereinafter abbreviated as GTO) including a pnpn-structure of four semiconductor layers of alternately different conductivity type realized in a semiconductor substrate and imparted with a self turn-off capability, it is required that the gate signal acts on over a whole area of a pn-junction (hereinafter referred to as cathode-emitter junction) formed between a cathode-emitter layer to which a cathode electrode is contacted and a cathode-base layer adjacent thereto. To this end, the cathode-emitter layer is usually divided into a plurality of strips each having a width in a range of 0.2 to 0.4 mm, wherein these cathode-emitter strips are enclosed by a gate electrode formed on the cathode-base layer. Since a unit GTO is constituted by an anode-emitter layer to which an anode electrode is contacted, an anode-base layer located adjacent to the anode-emitter layer, the cathode-base layer and one of the strip-like cathode-emitter layers (also referred to as the cathode-emitter layer strip), it may be regarded that the whole structure of GTO device has as many unit GTO's as the number of cathode-emitter layer strips implemented in juxtaposition in the semiconductor substrate.

The current capacity of the GTO device is determined for the most part by the area of the cathode-emitter layer. Accordingly, the number of the cathode-emitter layer strips and hence that of the unit GTO's are determined in dependence on the current capacity as required. For example, in the case of a power GTO device of a rated current capacity on the order of 1000 A, the number of the juxtaposed unit GTO's amounts to a very large value in a range of 300 to 500.

Thus, in the power GTO device of the above type, there arises an important problem as to a manner in which a large number of the unit GTO's are arrayed at the highest permissible density in the semiconductor substrate while assuring uniformity of the turn-off operations of the individual unit GTO's. To meet this requirement, the strip-like cathode-emitter layers are arrayed in a radial and coaxial multi-ring pattern in the semiconductor substrate.

FIG. 1 of the accompanying drawings shows a typical example of the array mentioned above in a schematic plan view as observed by facing toward the cathode. In this figure, a reference numeral 1 designates a semiconductor substrate, 2 denotes strip-like divided cathode-emitter layers of n-conductivity type, and 3 denotes a p-conductivity type cathode-base layer. It will be seen that a great number of strip-like cathode-emitter layers 2 of a same length are radially and coaxially arrayed in a four-ring pattern including four coaxial rings or annuli. It will further be noted that the individual cathode-emitter layer strips are radially arrayed in each of the rings in such a manner that substantially the same distance exists between the adjacent cathode-emitter layer strips at the ends located nearer to the center of the semiconductor substrate.

In the structure of the power thyristor described above, so far as all the individual unit GTO's are capable of switching operation in uniformity without fail, a satisfactory switching operation will have to be accomplished by the whole GTO device incorporated in the single semiconductor substrate 1 in response to the gate signal. In practice, however, it has been found that, in the GTO device composed of a large number of the unit GTO's arrayed radially and coaxially as mentioned above, there exist differences between the inner unit GTO's and the outer ones with respect to the switching operation and the on-state voltage. More specifically, that unit GTO which requires a relatively longer time for the switching operation, inter alia for the turn-off operation, with respect to other unit GTO's is often locally heated to give rise to a failed turn-off operation. On the other hand, the unit GTO of a lower on-state voltage draws larger current as compared with those having a higher on-state voltage, providing an obstacle to the satisfactory gate turn-off operation.

At present, there are known two types of structures for the unit GTO.

FIG. 2 of the accompanying drawings shows in an enlarged perspective view a section of a region A shown as enclosed by a double-dotted broken line in FIG. 1.

Referring to FIG. 2, the first type structure is composed of a strip-like cathode-emitter layer ($n_E$) 2, a cathode-base layer ($p_B$) 3, an anode-base layer 4 of n-conductivity type ($n_E$) and an anode-emitter layer 5 of p-conductivity type ($p_E$). The anode-base layer 4 incorporates therein emitter shorting layers 6 and 60 which are of $n(n^+)$-conductivity type and has a higher impurity concentration than that of the (n-type) anode-base layer 4. An anode electrode 7 is contacted to the anode-emitter layer 5 and the emitter shorting layers 6 and 60 in a low resistance ohmic contact, while a cathode electrode 8 is contacted to the cathode-emitter layer strip 2 in a low resistance ohmic contact and a gate electrode 9 is contacted to the cathode-base layer 3 in a low resistance ohmic contact. In more detail, the emitter short-circuiting layer 6 is positioned immediately below the cathode-emitter layer strip 2. The anode-emitter layer 5 lies immediately below peripheral regions of the cathode-emitter layer 2 and is enclosed by the emitter shorting layer 60. The gate electrode 9 is shown as provided at portions formed by removing or etching down a surface layer of the cathode-base layer 3 with a view for preventing the gate electrode 9 from being intermixedly contacted to the cathode electrode 8 when a cathode post (not shown) is press-contacted to the cathode electrode 8. Accordingly, the gate electrode 9 may be provided on the upper major surface of the substrate in the same plane as the cathode electrode 8, so far as the intermixed contact mentioned above can be evaded by some means.

A characteristic feature of the first type structure of the GTO described above resides in that the emitter short-circuiting layers 6 and 60 constitute a shorted emitter structure, whereby the rate of carrier injection from the anode-emitter layer can be suppressed to be low.

In the case of the second type structure, the emitter short-circuiting layers 6 and 60 are absent, while the anode-emitter layer is formed over the whole lower surface of the semiconductor substrate 1 without being short-circuited. In most of the second type structures, a life time killer such as gold is diffused to attain the desirable turn-off operation.

Results of experiments conducted by the inventors of the present application have shown that, in the case of the thyristor device constituted by the unit GTO's of the first type structure (emitter short-circuiting structure), the outer unit GTO's exhibit longer turn-off time than the inner ones in the radial and coaxial multi-ring array, while the on-state voltage of the unit GTO's becomes lower as they are located farther from the center of the coaxial multi-ring array. On the other hand, in the case of the second type structure in which the emitter is not short-circuited, the turn-off time of the unit GTO's is longer as they are located nearer to the center of the coaxial multi-ring array, while the on-state voltage of the unit GTO's is lower as they are positioned nearer to the center of the coaxial multi-ring array.

Accordingly, an object of the present invention is to provide a semiconductor switching device which comprises a plurality of unit GTO's incorporated in a semiconductor substrate and exhibiting an improved uniformity with respect to the respective switching operations and the turn-on voltage and which is thus improved with respect to a maximum current turn-off capacity.

Another object of the invention is to provide a semiconductor switching device which can enjoy an increased turn-off gain.

A further object of the invention is to provide a semiconductor switching device of a reduced size which can nevertheless control or handle powers of increased magnitudes.

According to an aspect of the present invention, there is provided a GTO device which comprises a plurality of strip-like cathode-emitter layers arrayed radially and coaxially in a multi-ring pattern, wherein length of the strip-like cathode-emitter layers is differentiated between those located at outer and inner regions of the coaxial multi-ring pattern.

More particularly, the length of the individual strip-like cathode-emitter layers (i.e. the cathode-emitter strips) constituting an inner ring of the co-axial multi-ring pattern is selected shorter than that of those which constitute an outer ring so that difference is produced in the length between the inner and the outer cathode-emitter strips of the coaxial multi-ring array.

In a preferred embodiment of the invention, the ratio between the length of a given one of the strip-like cathode-emitter layers and the diameter of the ring to which the given strip-like cathode-emitter layer belongs should preferably be constant among the different rings.

The above and other objects, novel features and advantages of the present invention will be more apparent from description of the exemplary embodiments of the invention. The description makes reference to the drawings, in which:

FIG. 5b is a sectional view taken along the line V—V in FIG. 5a;

Figure 1:
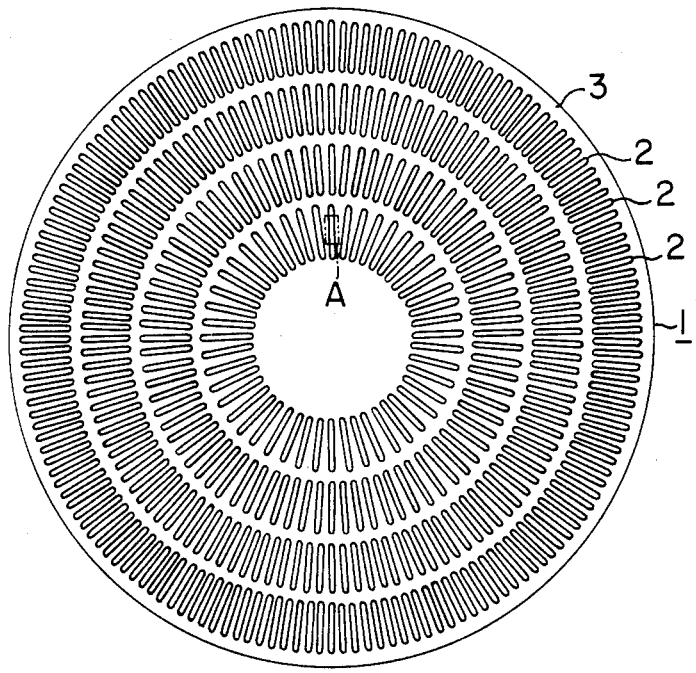
FIG. 1 is a schematic top plan view of a hitherto known GTO device as viewed facing to the cathode thereof.
Figure 6:
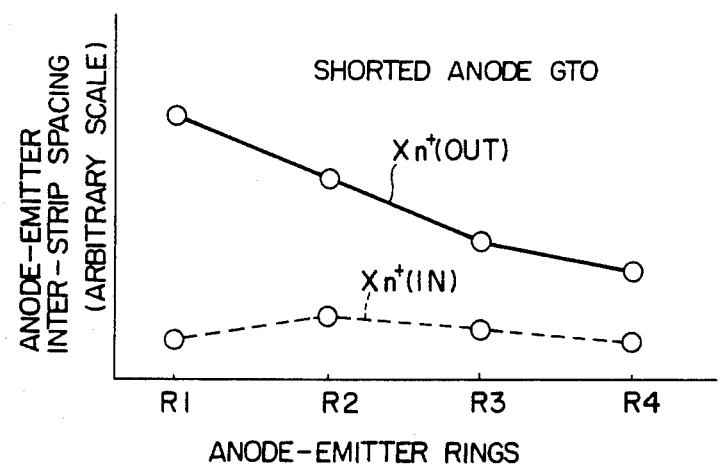
Figure 7:
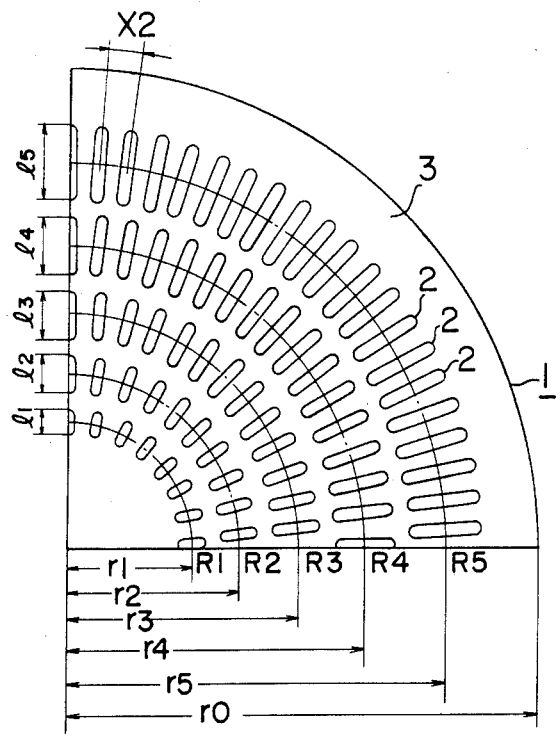
Figure 8:
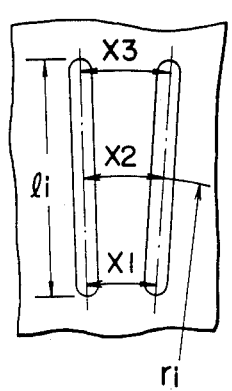
Figure 9:
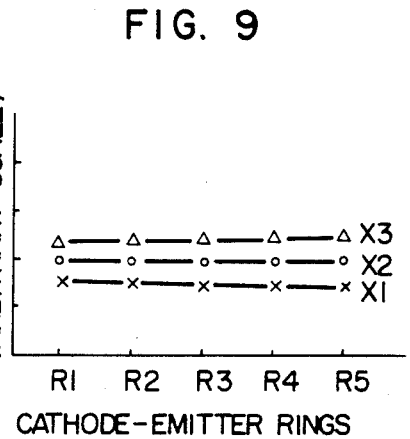
Figure 10:
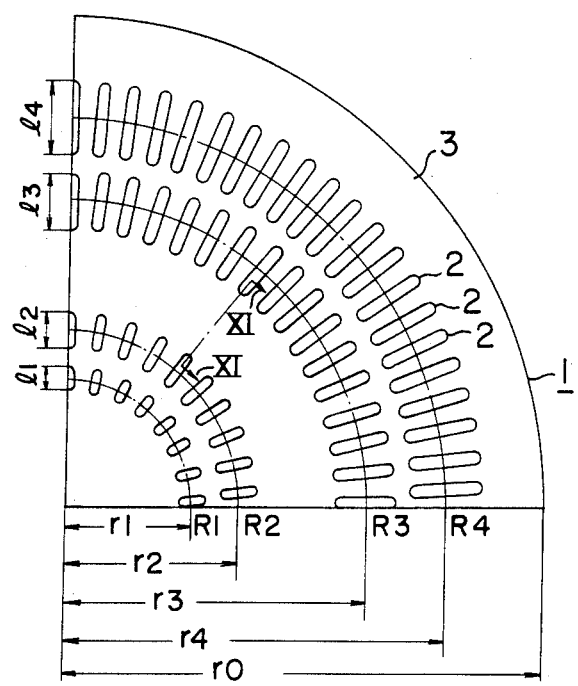
Figure 11:
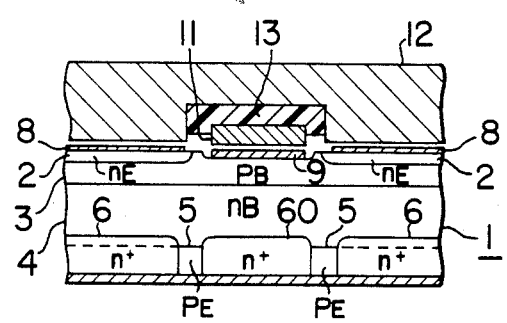

FIG. 6 graphically illustrates distributions determined from tests done by the present inventors of inter-anode-emitter layer spaces among different rings of strip-like cathode-emitter layers in the hitherto known GTO device shown in FIG. 1;

FIG. 7 is a schematic plan view showing a quarter of a GTO device according to an embodiment of the invention, as viewed facing to the cathode side;

FIG. 8 is a fragmental plan view of FIG. 7 showing two adjacent unit GTO's;

FIG. 9 graphically illustrates distributions of inter-cathode-emitter layer spaces among different rings of the strip-like cathode-emitter layers;

FIG. 10 is a view similar to FIG. 7 and shows another embodiment of the GTO device of an emitter short-circuiting structure according to the invention; and FIG. 11 is a sectional view taken along the line XI—XI in FIG. 10.

Now, the invention will be described in detail in conjunction with exemplary embodiments thereof.

Figure 2:
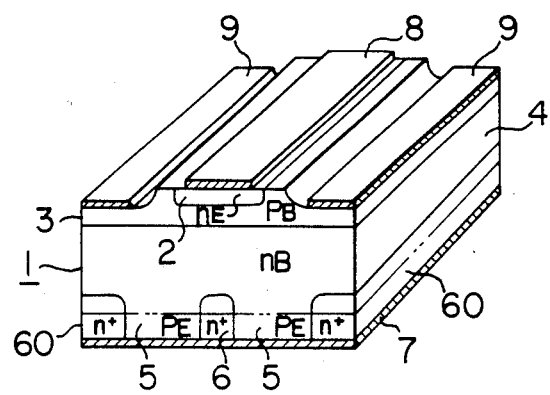
FIG. 2 is a sectional perspective view showing a region A indicated by a double-dotted broken line in FIG. 1 on an enlarged scale.
Figure 3:
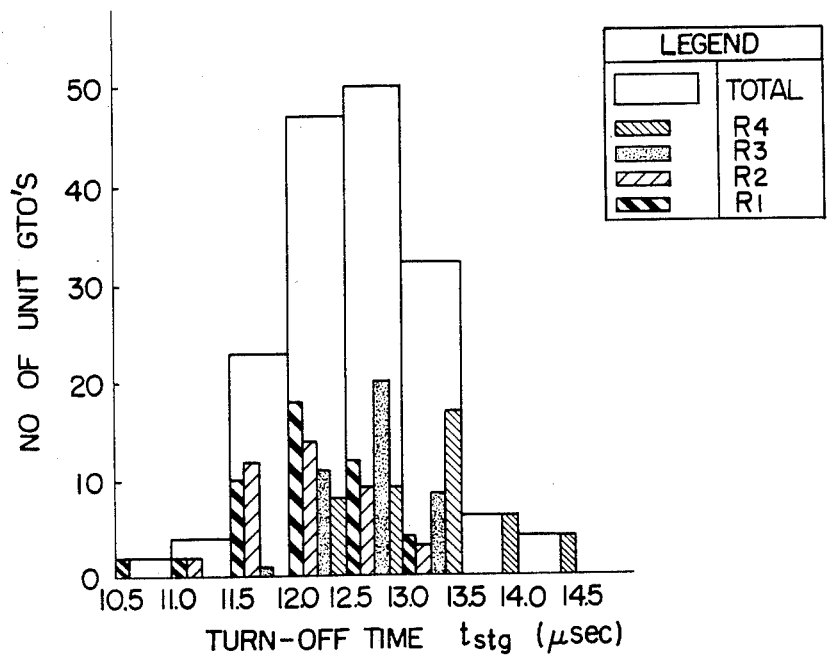
FIGS. 3 and 4 show histogram tests run by the present inventors of turn-off time and turn-on voltage, respectively, of the unit GTO's of the hitherto known structure shown in FIG. 2.
Figure 4:
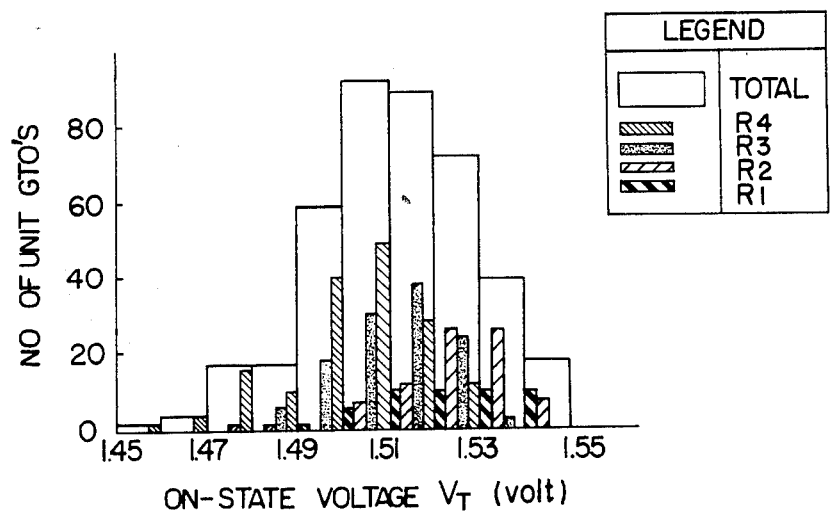

To have a better understanding of the concept of the present invention, reference is made to FIGS. 3 and 4 which show histograms of the unit GTO's of the hitherto known GTO device (described hereinbefore in conjunction with FIGS. 1 and 2) with respect to the turn-off time and the on-state voltage thereof. In these figures, reference letters $R_1$, $R_2$, $R_3$ and $R_4$ are used to designate the rings of the coaxial multi-ring array of the strip-like cathode-emitter layers shown in FIG. 1 in the order of the innermost ring to the outermost. Illustrated data have been obtained through measurements in which a constant current of 2.5 amperes (A) was conducted through each of the individual unit GTO's.

In the case of the GTO device of the shorted emitter structure belonging to the first category mentioned hereinbefore, it will be seen that there are differences in distributions of the turn-off time and the on-state voltage among the rings $R_1$, $R_2$, $R_3$ and $R_4$. In particular, the turn-off time of the unit GTO becomes longer, as the ring to which it belongs is located nearer to the outer periphery of the GTO device. The on-state voltage of the unit GTO's of the outer ring is lower than those belonging to the inner ring.

The non-uniformity in the characteristics (i.e. the turn-off time and the on-state voltage) among the individual unit GTO's may be explained as follows.

Figure 5A:
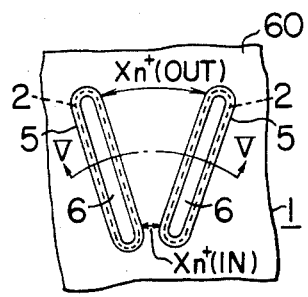
FIG. 5a shows in a fragmental plan view a major surface of a substrate in which anode-emitter layer for two adjacent unit GTO's is formed in the hitherto known GTO device shown in FIG. 2.
Figure 5B:
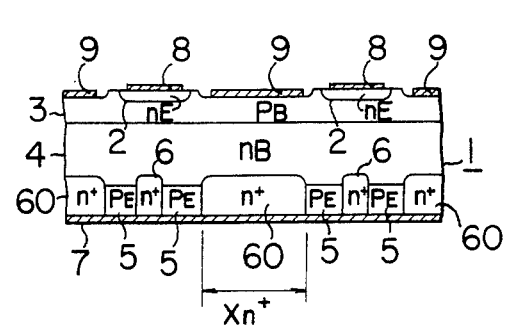

Reference is made to FIGS. 5a and 5b. The former shows two adjacent unit GTO's in a plan view as viewed from the above of the major surface on which the anode-emitter layer 5 is formed, while FIG. 5b shows the same in a sectional view taken along the line V—V in FIG. 5a. When a distance between the radially extending anode-emitter layers 5 of the two adjacnet unit GTO's is represented by $Xn+$ (FIG. 5b) with the minimum and the maximum distances therebetween being represented by $Xn+(in)$ and $Xn+(out)$, respectively, it can be seen from FIG. 6 that the minimum distance $Xn+(in)$ is substantially constant in all the four rings $R_1$, $R_2$, $R_3$ and $R_4$, while the maximum distance $Xn+(out)$ is decreased more as the ring in concern lies more outwardly, which is ascribable to the fact that the unit GTO's of a same length are radially arrayed in the four-ring pattern.

The difference in the maximum distance $X_n+(out)$ in turn gives rise to difference in the degree of emitter shorting among the rings $R_1$, $R_2$, $R_3$ and $R_4$. More specifically, the degree of the emitter shorting is reduced, as the concerned unit GTO is located more outwardly in the coaxial multi-ring array, as the result of which the quantity of carrier injected from the anode-emitter layer 5 is increased, involving elongation in the turn-off time and lowering in the on-state voltage.

In the case of the GTO of the second type structure in which the emitter is not short-circuited, the area of the anode-emitter layer 5 to be assigned for each of the strip-like cathode-emitter layer 2 is increased, as the unit GTO in concern lies more inwardly in the coaxial multi-ring array. As the consequence, the quantity of carriers injected from the anode-emitter layer 5 is correspondingly increased. Thus, the turn-off time of the unit GTO becomes longer as the ring to which it belongs is located more inwardly, while the on-state voltage becomes lower.

In the light of the results of the analyses elucidated above, the inventors of the present application have gotten an idea that, in the GTO device in which the strip-like cathode emitter layers are arrayed radially in a coaxial multi-ring pattern, difference be introduced with respect to the length of the strip-like cathode-emitter layers among the rings located outwardly (i.e. nearer to the outer periphery of the GTO device) and those located inwardly (i.e. nearer to the center of the GTO device) so that the quantity of carriers injected from the anode-emitter layer 5 becomes uniform among the different rings. Then, the current density in the individual unit GTO's and hence the turn-off time as well as the on-state voltage thereof can be made uniform to assure an improved switching operation of the whole GTO device.

A GTO device according to an exemplary embodiment of the invention is shown in FIG. 7 which is a plan view of a quarter portion of a semiconductor disc wafer constituting the GTO device of the shorted emitter structure. In this figure, parts same as or equivalent to those shown in FIG. 1 are denoted by the like reference symbols.

In the GTO device shown in FIG. 7, each of the unit GTO's defined by each of the cathode-emitter layer strips 2 is of the similar sectional structure as the one shown in FIG. 2.

The GTO device shown in FIG. 7 differs from the hitherto known one shown in FIG. 1 in that the radial lengths of the strip-like cathode-emitter layers 2 arrayed in coaxial rings $R_1$, $R_2$, $R_3$, $R_4$ and $R_5$ are increased progressively as the associated rings are located more outwardly (i.e. nearer to the outer periphery of the substrate disc), as is indicated by symbols $l_1$, $l_2$, $l_3$, $l_4$ and $l_5$.

In a numerical example, the radius $r_0$ of the semiconductor substrate disc 1 is selected to be 20 mm with the width of all the unit GTO's being 0.3 mm. On the conditions, the lengths $l_1$, $l_2$, $l_3$, $l_4$ and $l_5$ of the strip-like divided cathode-emitter layers belonging to the rings $R_1$, $R_2$, $R_3$, $R_4$ and $R_5$, respectively, are selected such that $l_1 \approx 1.0$ mm, $l_2 \approx 1.6$ mm, $l_3 \approx 2.0$ mm, $l_4 \approx 2.5$ mm and that $l_5 \approx 3.2$ mm. Further, the radii $r_1$ to $r_5$ of the rings $R_1$ to $R_5$, respectively, are selected such that $r_1 \approx 3.2$ mm, $r_2 \approx 7.2$ mm, $r_3 \approx 10$ mm, $r_4 \approx 12.5$ mm and that $r_5 \approx 16$ mm.

FIG. 8 shows in a plan view two adjacent strip-like cathode-emitter layers 2. When the distances between the longitudinal axes of these adjacent strip-like cathode-emitter layers 2 as measured at the inner end, mid portion and the outer end thereof are represented by $X_1$, $X_2$ and $X_3$, respectively, it has been found that these distances $X_1$, $X_2$ and $X_3$ are substantially constant among the different rings $R_1$ to $R_5$, as is graphically illustrated in FIG. 9.

With the arrangement of the strip-like cathode-emitter layers 2 mentioned above, the area of active semiconductor region allotted to the individual unit GTO is substantially constant throughout all the rings $R_1$ to $R_5$. In other words, the degree at which the emitter is short-circuited in the individual unit GTO is substantially uniformly distributed over the whole GTO device, as the result of which the current density for a unit length of the unit GTO is substantially constant throughout the whole GTO device, wherein currents are divided among the different rings $R_1$ to $R_5$ in dependence on the lengths $l_1$ to $l_5$ when the GTO device is conducting. Thus, the on-state voltages of all the unit GTO's appearing in the conducting state of the GTO device become substantially equal to one another. Further, the turn-off time of the unit GTO in the turn-off operation triggered by application of the off-gate signal to the gate electrode is substantially uniform over the whole GTO device regardless of the difference in the length of the unit GTO's, because of the fact that the current densities for a unit length in the unit GTO's as well as the degree of the emitter shorting in the individual unit GTO is substantially uniform throughout the whole GTO device and that the longer cathode-emitter layer is opposed with a correspondingly increased length of the gate electrode so that the off-gate signal current of magnitude corresponding to the length of the strip-like cathode-emitter layer is applied to the gate electrode of the unit GTO's.

In a preferred embodiment of the GTO device according to the invention, a relation between the radius $r_i$ of a given ring and the length $l_i$ of the cathode-emitter layer 2 belonging to that ring should be so selected that the ratio $l_i/r_i$ is constant for the reason mentioned below.

When the distance between two given adjacent strip-like cathode-emitter layers 2 is represented by a constant value $X_2$, the number of the unit GTO's which can be disposed in the ring having a radius $r_i$ is given by $2\pi r_i/X_2$, wherein the distance $X_3$ between the adjacent strip-like cathode-emitter layers as measured at the outer end thereof is given by $2\pi(r_i+l_i/2)/(2\pi r_i/X_2)$ while the inter-layer distance $X_1$ measured at the inner end is given by $2\pi(r_i-l_i/2)/(2\pi r_i/X_2)$. Thus, so long as the ratio $l_i/r_i$ is constant, the distances $X_1$ and $X_3$ can also be made constant.

In the GTO device of the second type structure in which the emitter is not short-circuited, the length $l_i$ of the strip-like cathode-emitter layer 2 located nearer to the periphery (center) of the substrate is selected longer (shorter), as is in the case of the GTO device shown in FIG. 7. With this arrangement, areas of the anode-emitter layers of the units GTO belonging to the ring located nearer to the periphery of the semiconductor substrate disc is larger than those of the rings located nearer to the center of the substrate disc, assuring thus the substantially uniform current density for a unit length of all the unit GTO's, whereby the turn-on time and the on-state voltage are substantially made uniform for all the unit GTO's.

As will be appreciated from the foregoing, there has been provided a GTO device whose capability of breaking a maximum current is significantly increased and which exhibits a satisfactory turn-off operation with a small off-gate signal without involving local concentration of current at some unit GTO's by virtue of the feature that the current density for a unit length of the unit GTO is substantially same for all the unit GTO's, assuring a substantially same on-state voltage for all the unit GTO's.

Because a large current can be interrupted with the off-gate signal of small magnitude, a high turn-off gain is obtained. Further, since the current can flow through all the unit GTO's at rates determined in dependence on the lengths of the unit GTO's without involving any regions where no current flows, it is possible to control effectively and efficiently a large power with a reduced size of the semiconductor substrate.

Another exemplary embodiment of the GTO according to the invention is shown in FIG. 10, in which same reference symbols as those used in FIG. 7 denote parts which are same as or equivalent to those shown in FIG. 7.

The GTO device shown in FIG. 10 differs from the one shown in FIG. 7 in that the number of the coaxially arrayed rings is four. In a numerical example, the rings $R_1$ and $R_2$ may be implemented equally to the rings $R_1$ and $R_2$ of the GTO device shown in FIG. 7, while the rings $R_3$ and $R_4$ may be realized equally to the rings $R_4$ and $R_5$ of the switching device shown in FIG. 7. More concretely, $r_0 \approx 20$ mm, $r_1 \approx 3.2$ mm, $r_2 \approx 7.2$ mm, $r_3 \approx 12.5$ mm and $r_4 \approx 16$ mm, while $l_1 \approx 1.0$ mm, $l_2 \approx 1.6$ mm, $l_3 \approx 2.5$ mm and $l_4 \approx 3.2$ mm. The ring $R_3$ shown in FIG. 7 is absent in the device shown in FIG. 10. At the region corresponding to the ring $R_3$ shown in FIG. 7, the cathode-base layer 3 is exposed and a gate electrode 9 is ohmic contacted with a low resistance to an etched-down region, as is illustrated in FIG. 11. A ring-like gate electrode plate 11 is press-contacted at this region. The gate electrode plate 11 is formed integrally with a cathode electrode plate 12 through an interposed insulating layer 13, the cathode electrode plate 12 being press-contacted to the cathode electrodes 8 which in turn are ohmic contacted to each of the cathode-emitter layer 2 with a low resistance. More specifically, there is formed in a lower major surface of the cathode electrode plate 12 a ring-like or annular grooves in which the ring-like electrode plate 11 is held with the insulating layer 13 being interposed. When the cathode electrode plate 12 is press-contacted to the individual cathode electrodes 8, the gate electrode plate 11 is also press-contacted to the gate electrodes 9 provided at the region, where the ring $R_3$ of the device shown in FIG. 7 is spared. Of course, the gate electrodes 9 are also provided at other portions so as to enclose the individual cathode-emitter layer 2, as is shown in FIGS. 1 and 2.

Since the GTO device shown in FIG. 10 incorporates the gate electrode plate 11 disposed between the rings $R_2$ and $R_3$, it may be said that this GTO device presents an intermediate ring gate structure.

An advantage brought about by the structure mentioned above resides in that the gate signal can reach the unit GTO's of the different rings $R_1$, $R_2$, $R_3$ and $R_4$ more rapidly as compared with the structure where the gate lead wire is bonded to a center or a peripheral portion of the semiconductor substrate 1 and that the resistive voltage drop in the gate electrode 9 can be reduced, whereby the switching operations of the individual unit GTO's can be much equalized.

The present invention may be realized in various manners mentioned below.

(1) The radial array of the cathode-emitter layers is neither restricted to the coaxial five-ring array shown in FIG. 7 nor to the coaxial four-ring array shown in FIG. 10 but may be implemented in a coaxial multi-ring array including a given number of the rings.

(2) The gate electrode is only required to be disposed around the individual cathode-emitter layers, wherein the gate signal may be applied at any location of the gate electrode.

(3) The switching device to which the invention can be applied may incorporate therein an auxiliary thyristor portion such as amplifying gate structure, FI gate structure, regenerative gate structure or the like in addition to the main thyristor structure implemented according to the teachings of the invention.

(4) The invention can also be applied to a reverse conducting GTO in which diode regions are realized in an anti-parallel structure and which incorporates a thyristor realized according to the teaching of the invention.

(5) The radial length of the cathode-emitter layers need not be different from one to another ring. In the case of the coaxial four-ring array, for example, the cathode-emitter strip layers constituting two inner rings may have a same length which is however different from that of the cathode-emitter strip layers constituting the two outer rings. In other words, length of the cathode-emitter strip layers may be differentiated stepwise between or among sets of the coaxial rings.

(6) The cathode electrode and the gate electrode need not be disposed in different planes as shown in FIG. 2, but they may be so provided that the upper major surface of the semiconductor switching device is flat.

(7) The emitter short-circuiting layer 6 disposed immediately below the cathode-emitter layer 2 (FIG. 5) may be replaced by an integral portion of the anode-emitter layer 5.

(8) The GTO device of the shorted emitter structure may be diffused with a lifetime killer for the purpose of shortening the turn-off time.

(9) The invention can also be applied to a GTO device which is turned off by an electric signal and turned on by a light signal.

(10) The invention may be realized in a square semiconductor substrate with the cathode-emitter layers being formed in the coaxial multi-ring array.

We claim:

1. A semiconductor switching device comprising:
   (a) a semiconductor substrate including a cathode-emitter layer, a cathode-base layer, an anode-base layer and an anode-emitter layer, said layers having conductivity types differing alternately from one another between the adjacent layers;
   (b) said cathode-emitter layer being divided into a plurality of strip-like cathode-emitter regions which are arrayed on a major surface of said semiconductor substrate in a coaxial multi-ring pattern, each cathode-emitter region being elongated along the radial direction of the ring;

(c) the strip-like cathode-emitter regions which constitute an inner ring in said coaxial multi-ring pattern having a length in said radial direction shorter than the length in the radial direction of strip-like cathode-emitter regions constituting an outer ring in said multi-ring pattern;

(d) cathode electrodes contacted to said strip-like cathode emitter regions in low resistance contact;

(e) gate electrodes disposed so as to enclose said strip-like cathode-emitter regions and contacted to said cathode-emitter regions in low resistance contact; and (f) an anode electrode contacted to said anode-emitter layer in low resistance contact.

2. A semiconductor switching device according to claim 1, wherein a ratio of the radial length of the strip-like cathode-emitter regions constituting a given one of the rings of said coaxial multi-ring pattern to the radius of said given ring is substantially invariable among the rings included in said coaxial multi-ring pattern.

3. A semiconductor switching device according to claim 1, wherein distance between two adjacent strip-like cathode-emitter regions is of an invariable value throughout all of said rings.

4. A semiconductor switching device according to claim 1, wherein said anode-emitter layer is present at least at locations immediately below said strip-like cathode-emitter regions as viewed in the direction in which said cathode-emitter regions is projected toward the anode.

5. A semiconductor switching device according to claim 1, wherein a gate electrode to be supplied with a gate signal is positioned at the center of said semiconductor substrate.

6. A semiconductor switching device according to claim 1, wherein a gate electrode to be supplied with a gate signal is located at an intermediate portion between the rings of said cathode-emitter regions of said coaxial multi-ring pattern.

7. In a semiconductor thyristor device of pnpn type formed in a semiconductor substrate and including a multiplicity of elongated n type cathode-emitter regions disposed in a multi-ring configuration, each ring being constituted by a plurality of cathode-emitter regions, each cathode emitter region being oriented to be elongated along the radial direction of the ring with respect to a center of said ring configuration, a cathode-emitter structure comprising:

said cathode-emitter regions having respective radial lengths which monotonically increase with the distance of the cathode-emitter region from the center of said multi-ring configuration.

8. A cathode-emitter structure according to claim 7, wherein said cathode-emitter regions are so disposed that each pair of adjacent cathode-emitter regions are distanced from one another by substantially constant distances at an inner end, at a mid position and at an outer end regardless of the ring position.

9. A semiconductor switching device according to claim 1, wherein said multi-ring pattern comprises at least three coaxial rings $R_1$, $R_2$ and $R_3$, arranged with the ring $R_1$ being closest to the center of said coaxial rings, the ring $R_3$ being farthest from said center and said ring $R_2$ being between said rings $R_1$ and $R_3$, and further wherein the respective radial lengths of said strip-like cathode-emitter regions in a direction elongated along the radial direction of the ring are set according to the relation:

$$lR_1 < lR_2 < lR_3$$

where
$lR_1$ is the radial length of the strip-like cathode-emitter regions of the ring $R_1$,
$lR_2$ is the radial length of the strip-like cathode-emitter regions of the ring $R_2$; and
$lR_3$ is the radial length of the strip-like cathode-emitter regions of the ring $R_3$.

10. A semiconductor switching device according to claim 1, wherein the respective lengths of the strip-like cathode emitter regions in said inner and outer rings are set to provide a substantially uniform turn-off time and on-state voltage for unit GTO's formed by each of said strip-like cathode-emitter regions with said cathode-base layer, said anode-base layer and said anode-emitter layer.

11. A semiconductor switching device according to claim 9, wherein the respective lengths of the strip-like cathode emitter regions in said at least three rings are set to provide a substantially uniform turn-off time and on-state voltage for unit GTO's formed by each of said strip-like cathode-emitter regions with said cathode-base layer, said anode-base layer and said anode-emitter layer.

* * * * *